(12) United States Patent
Morii

(10) Patent No.: US 7,423,333 B2
(45) Date of Patent: Sep. 9, 2008

(54) CERDIP TYPE OF SOLID-STATE IMAGE SENSING DEVICE, STRUCTURE AND METHOD FOR GRIPPING CERDIP TYPE OF SOLID-STATE IMAGE SENSING DEVICE

(75) Inventor: Yoshihiro Morii, Ohta-ku (JP)

(73) Assignee: Ricoh Company, Ltd., Tokyo (JP)

( * ) Notice: Subject to any disclaimer, the term of this patent is extended or adjusted under 35 U.S.C. 154(b) by 703 days.

(21) Appl. No.: 11/041,304

(22) Filed: Jan. 25, 2005

(65) Prior Publication Data
US 2005/0128337 A1    Jun. 16, 2005

Related U.S. Application Data

(62) Division of application No. 10/195,105, filed on Jul. 15, 2002, now Pat. No. 6,869,823.

(30) Foreign Application Priority Data
Jul. 13, 2001    (JP)    .............................. 2001-213706

(51) Int. Cl.
*H01L 23/02*    (2006.01)
*H01L 23/12*    (2006.01)

(52) U.S. Cl. ............... 257/680; 257/701; 257/E23.183; 257/E23.188; 257/E23.192

(58) Field of Classification Search .......... 257/E23.141, 257/E23.18, E23.183, E23.188, E23.191, 257/E23.192, E23.193
See application file for complete search history.

(56) References Cited

U.S. PATENT DOCUMENTS 5,757,075 A * 5/1998 Kitaoka ...................... 257/712
5,877,546 A * 3/1999 You ........................... 257/680
6,693,751 B2 * 2/2004 Morii et al. .................. 359/819

\* cited by examiner

*Primary Examiner*—Scott B. Geyer
(74) *Attorney, Agent, or Firm*—Oblon, Spivak, McClelland, Maier & Neustadt, P.C.

(57) ABSTRACT

A cerdip type of solid-state image sensing device includes a base on which photoelectric transfer devices are arranged in line along a main scanning direction, a sealed glass disposed on the base for fixing a lead frame, a wind frame disposed on the sealed glass, a transparent cover glass disposed on the wind frame, and a gripped surface for gripping the cerdip type of solid-state image sensing device.

11 Claims, 9 Drawing Sheets

CERDIP TYPE OF SOLID-STATE IMAGE SENSING DEVICE, STRUCTURE AND METHOD FOR GRIPPING CERDIP TYPE OF SOLID-STATE IMAGE SENSING DEVICE

CROSS-REFERENCE TO RELATED APPLICATIONS

This application is a divisional of U.S. patent application Ser. No. 10/195,105, filed Jul. 15, 2002, now U.S. Pat. No. 6,869,823 which claims the benefit of priority from Japanese Patent Application No. 2001-213706, filed Jul. 13, 2001, the entire contents of each of which are incorporated herein by reference.

BACKGROUND OF THE INVENTION

1. Field of the Invention

The present invention relates to a cerdip type of solid-state image sensing device, a structure and a method for gripping the cerdip type of solid-state image sensing device for using in the interior of an image reading apparatus such as a copying machine, an image scanner, a facsimile or the like.

2. Description of the Prior Art

Generally, an image reading apparatus which is incorporated in an imaging apparatus and reads an image as an optical image by use of a solid-state image sensing device such as a CCD and so on is configured to read by focusing an object 53 on a solid-state image sensing device 61 through a focused lens 52 as shown in FIG. 10.

The used solid-state image sensing device 61 has a plurality of micro-photoelectric transfer devices (hereinafter, referred to as pixels each having normally a micro-size of several μm by several μm) in which a pixel line 31 is arranged in one straight line.

In such an image reading apparatus, a linear image focused by the focused lens 52 is positioned on the solid-state image sensing device 61 and the focused lens 52 or one linear pixel line 31 of the solid-state image sensing device 61 must be micro-motioned about X, Y and Z axes, in rotational directions of β and γ about Y and Z axes, respectively, (three axes and two rotational directions in five axes of X, Y, Z, β and γ axes) for adjusting a position thereof to read optical characteristic (focusing, magnification and so on) with a predetermined accuracy, as shown in FIG. 11.

Note that reference numeral 8 denotes an optical axis.

Here, a reason that adjustment is not effected with respect to an α axis about the X axis is as follows.

When the β and γ axes which are vertical with the pixel line is not adjusted, a distance between the focused lens 52 and solid-state image sensing device 61 is different every the pixel to deteriorate the accuracy of optical characteristic. On the contrary, since the X axis is parallel with the pixel line, the distance between the focused lens 52 and solid-state image sensing device 61 is not different every the pixel, and thus the optical characteristic is not subjected to an influence.

On the other hand, in recent, there may be used a solid-state image sensing device having three pixel lines 31a, 31b and 31c linearly arranged in every pixels R, G and B which have a peak of spectral sensitivity in Red, Green and Blue to read color images as shown in FIG. 12.

Normally, a high precision is required to position adjustment of the solid-state image sensing device in 5 axis directions. There is required a technic to accomplish such requirement in which if the solid-state image sensing device is attached to a frame, after position of the solid-state image sensing device is adjusted as described above, the position of the solid-state image sensing device is not deviated from the frame.

A reason why such technic is required is because of requiring readjustment even though the high precision for the adjustment is performed when the position of the solid-state image sensing device deviates from the frame on attachment and requiring disposal of an attached part in a case of adopting an attaching method which is not separatable, thereby bringing to a long positioning adjustment and resulting in a high cost attaching method.

The solid-state image sensing device 61 is, also, mounted on a base 12 within the imaging apparatus. The base 12 drives the solid-state image sensing device 61 and acts to transmit an electrical output signal of the solid-state image sensing device 61 according to an optical image to a control section (not shown) of the image reading apparatus after the electrical output signal is electrically processed.

If an object to be read in the image reading apparatus is an image, a line type of solid-state image sensing device in which a plurality of micro photoelectric transfer devices are disposed in one line is almost used. In this case, the image is read as a linear image. In a color image reading apparatus for reading a color image, a color solid-state image sensing device having three lines 31a, 31b and 31c in which pixels having a peak of spectral sensitivity in Red (hereinafter referred to as R), Green (hereinafter referred to as G) and Blue (hereinafter referred to as B) are arranged in three lines every R, G and B is used (see FIG. 12).

Furthermore, the solid-state image sensing device is classified in several kind by an outside structure (package structure). In recent, the cerdip type of solid-state image sensing devise is increasingly used even in an image reading apparatus for a low production cost.

FIG. 13 is a sectional view showing a basic structure of a conventional cerdip type of solid-state image sensing device (for color, herein).

The cerdip type of solid-state image sensing device has a construction as follows.

A CCD chip 63 which is a chip of the solid-state image sensing device is mounted on a base 62 of ceramic. Pixel lines 31a, 31b and 31c are formed on the CCD chip 63. A lead frame 65 is secured to the base 62 by means of sealed glass 64 and is electrically connected to the CCD chip 63 by wire-bonding between the lead frame 65 and CCD chip 63 with a lead wire 68. A wind frame 66 is bonded with the sealed glass 64. A transparent cover glass 67 is secured to the wind frame 66 to seal the CCD chip 63.

As described above, in the image reading apparatus, the linear image focused by the focused lens 52 is positioned on the solid-state image sensing device 61 and the solid-state image sensing device 61 must be micro-motioned along or about the five axes of X, Y, Z, β and γ as shown in FIG. 11 for adjusting a position thereof to read the optical characteristic (focusing, magnification and so on) with a predetermined accuracy during a producing step of the image reading apparatus.

Then, normally, an accuracy of the positioning adjustment of the solid-state image sensing device is μm or 0.001° order in all the five axes.

Here, the optical axis 8 in FIGS. 11 and 13 corresponds to a direction of the Z axis in a coordinate.

Directions of the X and Y axes correspond to main and sub scanning directions, respectively in the image reading apparatus.

Further, α is about the X axis, β is about the Y axis and γ is about the Z axis.

It is necessary to grip the solid-state image sensing device 61 with a producing apparatus (not shown) on production to perform the positioning adjustment as described above.

It, then, is considered that the solid-state image sensing device is not directly gripped, the base on which the solid-state image sensing device is mounted is gripped as an object of gripping.

However, the base 12 has a problem in a point of stiffness since the base comprises a thin plate and normally, does not make of a material having a high stiffness.

Upon gripping of a base having a low stiffness, the gripping causes the base to deform resiliently to occur change of position of the solid-state image sensing device 61. There is no problem on this fact if a product has a low adjusting accuracy, but, if the solid-state image sensing device is used for an image reading apparatus to which a high accuracy should be requested, this deformation of the base becomes a large problem.

Under the aforementioned circumstances, it is desirable that the solid-state image sensing device is directly gripped as an object of gripping on production.

In prior art, the cerdip type of solid-state image sensing device which is economically advantageous, as described above has no any part suitable to grip. Namely, since a side 62a of the base 62 and a side 66a of the wind frame 66 are closing as shown in FIG. 14, there is no plane of gripping by a chuck.

Note that in FIG. 14, only a positional relationship of the base 62 and wind frame 66 is magnifically shown and the sealed glass 64 and cover glass 64 and so on are omitted. A side 61a may not be a gripped plane of a chuck for projection of the side of the sealed glass 64 as shown in FIG. 13.

As described above, there is no a cerdip type of solid-state image sensing device in which ability of gripping is considered in the prior art.

In a such condition, a gripping portion of the device must be provided on the base 12.

This results in elimination of adjusting accuracy of the image reading apparatus or a high cost of the image reading apparatus by no using the cerdip type of solid-state image sensing device. As a result, it is not compatible with an image reading quality and economics.

SUMMARY OF THE INVENTION

From the above circumstances, it is an object of the present invention to provide a cerdip type of solid-state image sensing device and a structure and a method for gripping the solid-state image sensing device.

To accomplish the above object, a cerdip type of solid-state image sensing device according to one aspect of the present invention is characterized by comprising a base on which photoelectric transfer devices are arranged in line along a main scanning direction, a sealed glass disposed on said base for fixing a lead frame, a wind frame disposed on said sealed glass, a transparent cover glass disposed on said wind frame, and gripped surface means for gripping said cerdip type of solid-state image sensing device.

The gripped surface means is formed by grinding a portion of outer peripheral surfaces of said base, sealed glass, wind frame and cover glass after they are superposed.

A cerdip type of solid-state image sensing device according to the other aspect of the present invention is characterized by comprising a base on which photoelectric transfer devices are arranged in line along a main scanning direction, a sealed glass disposed on said base for fixing a lead frame, a wind frame disposed on said sealed glass, a transparent cover glass disposed on said wind frame, and gripped surface means provided on said cerdip type of solid-state image sensing device to grip it.

The gripped surface means is composed of side surfaces of one or more of said base, sealed glass, wind frame and cover glass.

The side surfaces which are gripped are parallel with a direction that said base, sealed glass, wind frame and cover glass are superposed and said main scanning direction, and most project over the side surfaces which are not gripped in a vertical direction to a plane including said superposed and main scanning directions.

One example, the gripped surface means may be composed of the side surfaces of said base, sealed glass and wind frame.

The gripped surface means may be composed of the side surfaces of said base and wind frame.

The gripped surface means may be comprised of the surfaces of said base and sealed glass.

The gripped surface means may be composed of the side faces of said sealed glass and wind frame.

The gripped surface means is composed of the side surfaces of said base.

The gripped surface means may be composed of the side surfaces of said sealed glass.

The gripped surface means may be composed of the side surfaces of said wind frame.

According to the other aspect of the present invention, provided is a structure for gripping a cerdip type of solid-state image sensing device comprising a base on which photoelectric transfer devices are arranged in line along a main scanning direction, a sealed glass disposed on said base for fixing a lead frame, a wind frame disposed on said sealed glass, a transparent cover glass disposed on said wind frame and gripped surface means provided on one or more of said base, sealed glass, wind frame and cover glass for gripping said cerdip type of solid-state image sensing device.

According to the further other aspect of the present invention, provided is a method for gripping a cerdip type of solid-state image sensing device comprising preparing a base on which photoelectric transfer devices are arranged in line along a main scanning direction, disposing a sealed glass on said base for fixing a lead frame, disposing a wind frame on said sealed glass, disposing a transparent cover glass on said wind frame and providing gripped surface means on one or more of said base, sealed glass, wind frame and cover glass for gripping said cerdip type of solid-state image sensing device.

BRIEF DESCRIPTION OF THE DRAWINGS

FIG. 2(A) is a view as viewed from the same direction as the cerdip type of solid-state image sensing device in FIG. 1, and FIG. 2(B) is a view showing a cover glass from a direction of a Z axis.

DETAILED DESCRIPTION OF THE PREFERRED EMBODIMENTS

Figure 1:
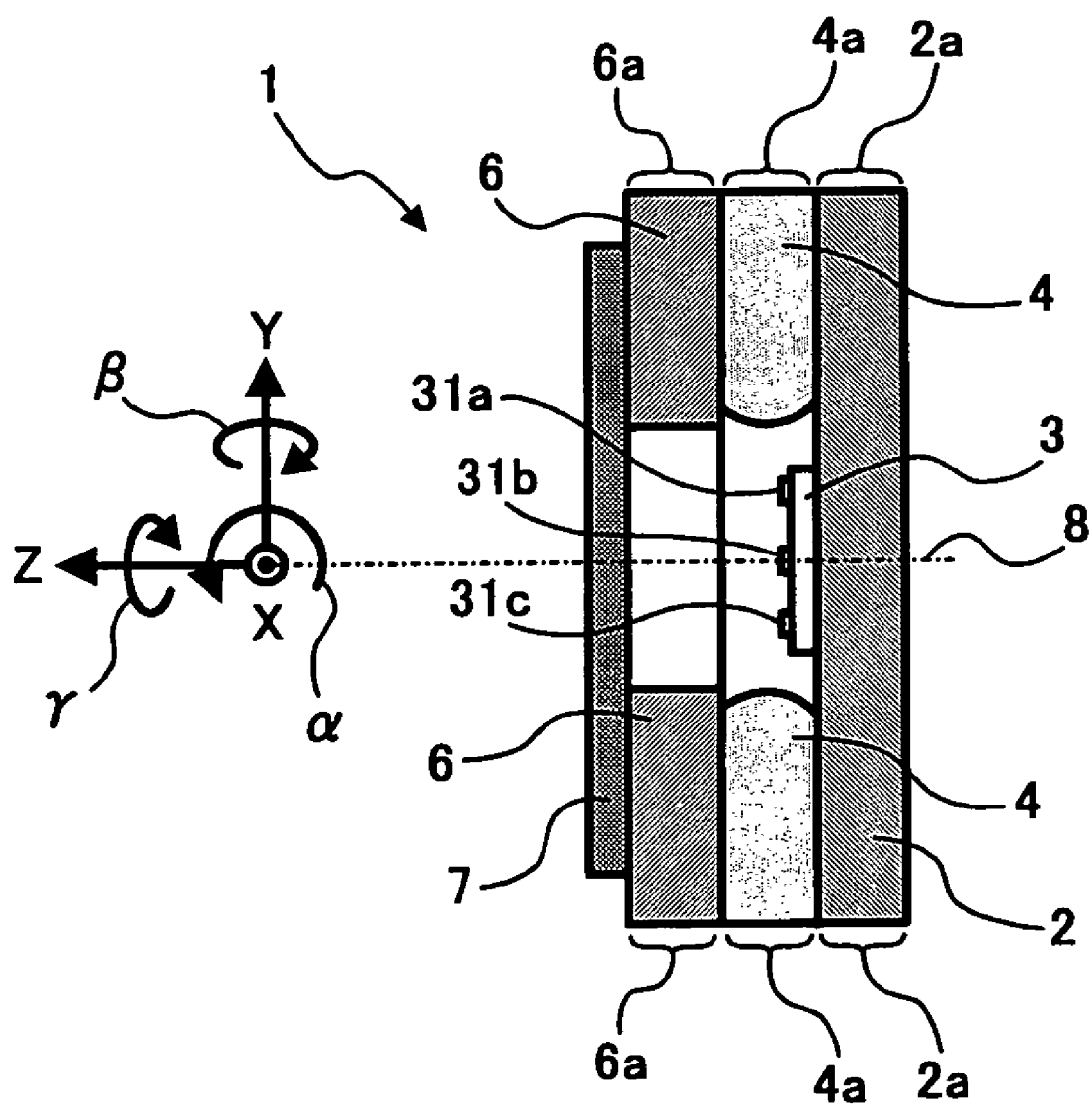
FIG. 1 is a sectional view of a cerdip type of solid-state image sensing device in a first embodiment according to the present invention.

A first embodiment of a cerdip type of solid-state image sensing device 1 according to the present invention is shown in FIG. 1.

The cerdip type of solid-state image sensing device 1 is constructed to superpose a base 2 of ceramic, a CCD chip 3 mounted on the base 2, a sealed glass 4 provided on an outer periphery of the CCD chip 3 on the base 2, a wind frame 6 of ceramic attached through the sealed glass 4 to the base 2 and a cover glass 7 attached to the wind frame 6 to seal the CCD chip 3.

The cerdip type of solid-state image sensing device 1 is provided with a gripped structure which comprises gripped surface means. The gripped surface means is formed from side surface means which is, for example, composed of upper and lower side surfaces 2a of the base 2, upper and lower side surfaces 4a of the sealed glass 4 and/or upper and lower side surfaces 6a of the wind frame 6.

These side surfaces 2a, 4a and 6a form the same plane.

The gripping surface means is parallel to a plane including a superposed direction, namely, an optical direction and a main scanning direction (direction of the pixel lines, namely, vertical direction to a surface of the drawing) and has a surface more projected in a direction vertical to a plane including the superposed and main scanning directions.

The gripping surface means (comprising the side surfaces 2a, 4a and 6a) can be engaged with an engaged surface 10a of a chuck 10 for adjustment.

For example, the side surfaces 2a, 4a and 6a are simultaneously ground by holding with a jig after the base 2 and wind frame 6 are bonded by the sealed glass 4 in order to form the side surfaces 2a, 4a and 6a in a parallel condition with the plane including the optical and main scanning directions.

Figure 13:
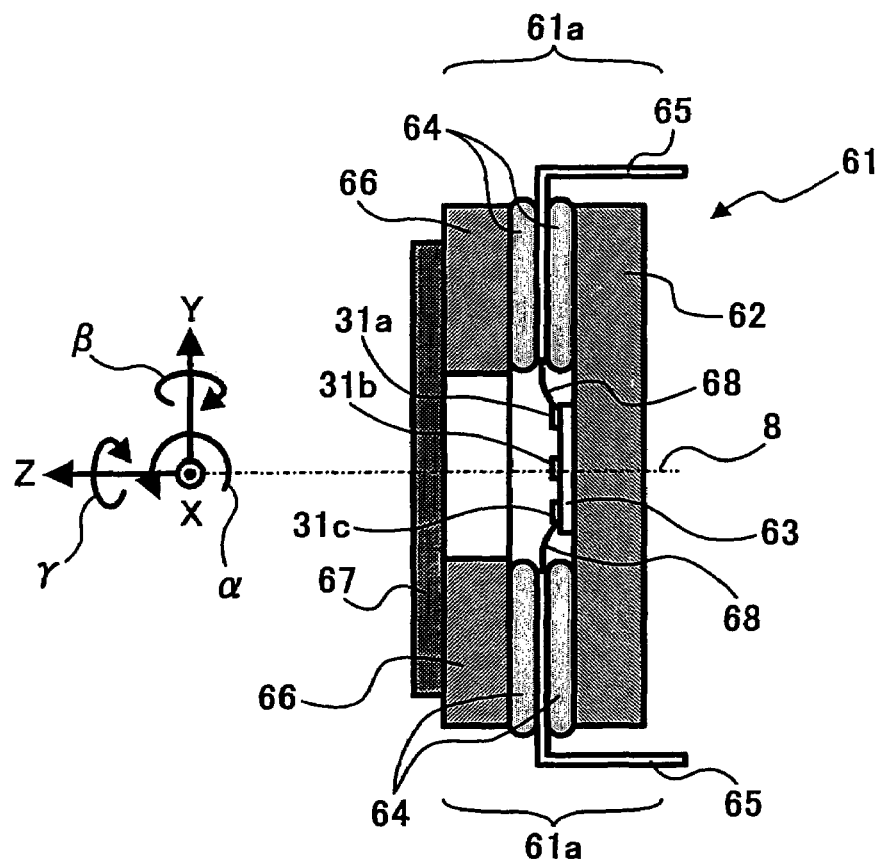
FIG. 13 is a sectional view showing a basic construction of the conventional cerdip type of solid-state image sensing device.
Figure 14:
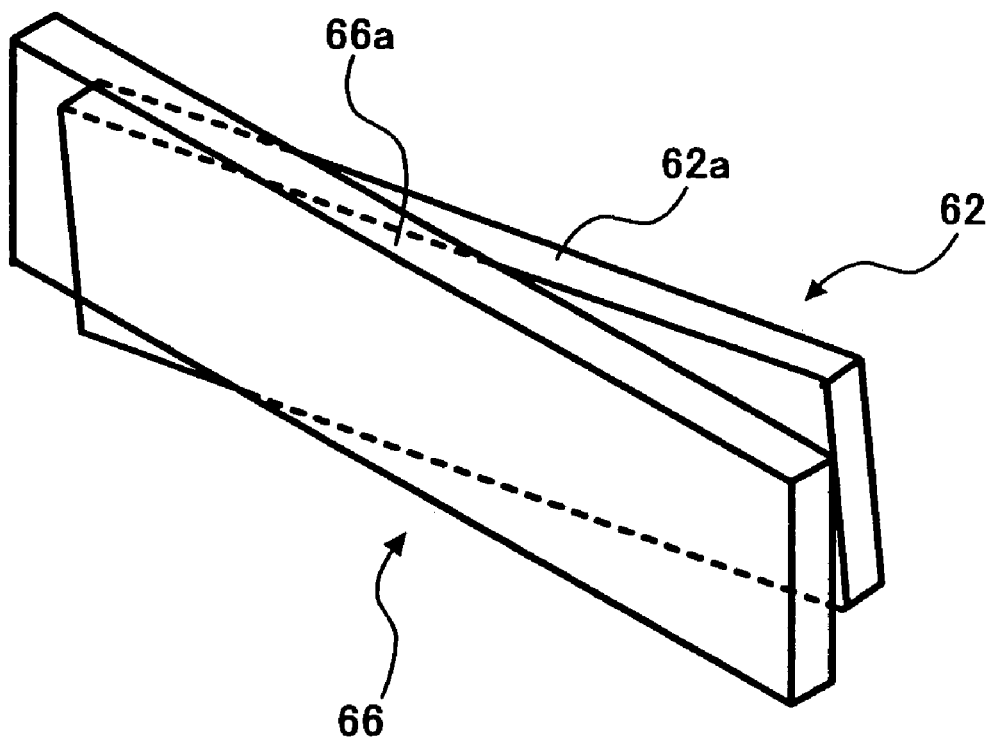
FIG. 14 is a perspective view showing side surfaces of the cerdip type of solid-state image sensing device.

FIG. 2 is a view showing a gripped condition of the cerdip type of solid-state image sensing device in FIG. 1 by means of the chuck in an apparatus for producing the image reading apparatus, (A) is a view showing the cerdip type of solid-state image sensing as viewed from the same direction as FIG. 1 and (B) is a view showing the cover glass as viewed from the direction of the same Z axis as in FIG. 13 (see FIG. 1).

Figure 2A:
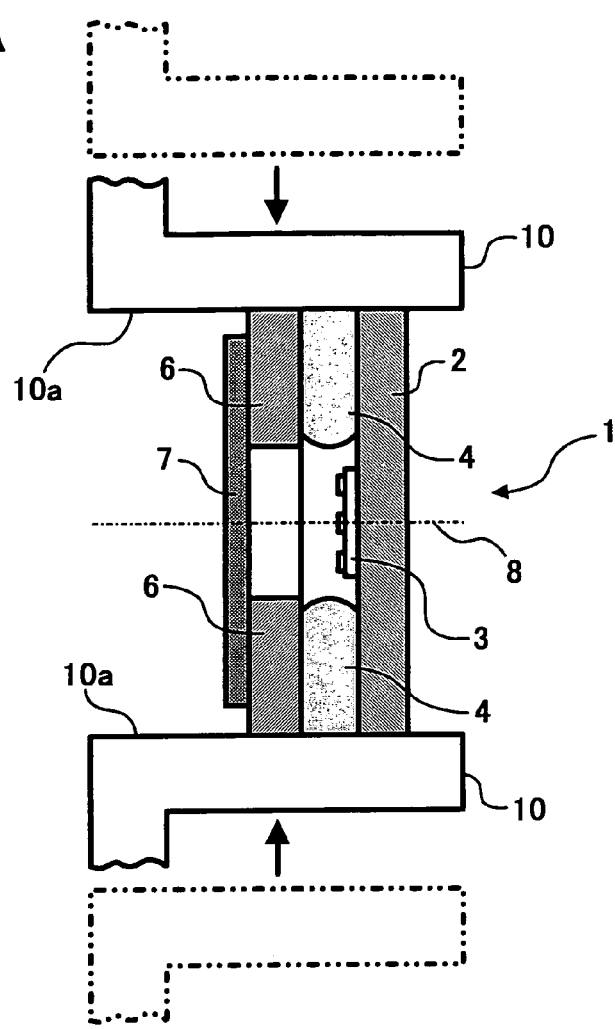
FIGS. 2(A) and 2(B) are views showing a state of gripping the cerdip type of solid-state image sensing device in FIG. 1 by a chuck of a producing apparatus in an image reading apparatus.

As shown in FIG. 2(A), upon production of the image reading apparatus, in order to adjust a position of one or more lenses and the cerdip type of solid-state image sensing device 1, the chuck 10 in the producing apparatus grips the side surfaces 2a, 4a and 6a from upward and downward.

Here, the engaged surface 10a of the chuck 10 which engages with the cerdip type of solid-state image sensing device is, also, formed into a plain which is parallel with the plane including the directions of the optical axis and main scanning.

Figure 2B:
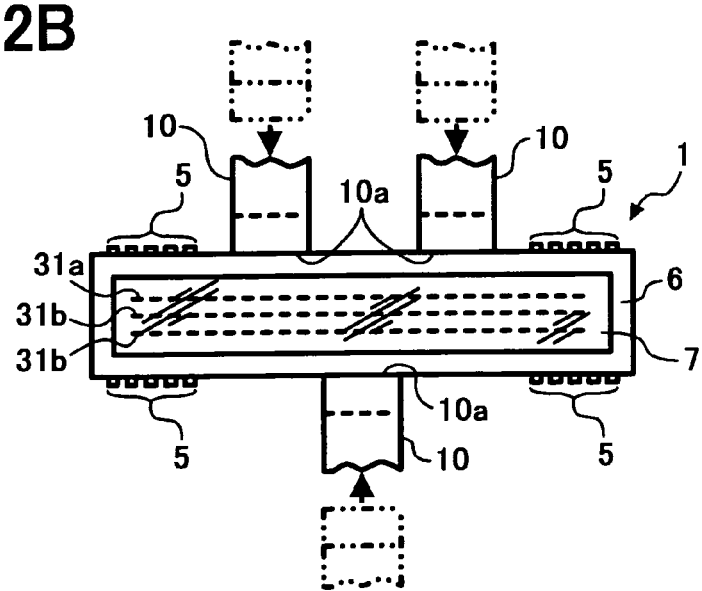

As shown in FIG. 2(B), the side surface means gripped by the chuck 10 is not provided with the same lead frames 5 as the lead frames 65 as described above in FIG. 13. The lead frames 5 are disposed on the longitudinal opposed ends of the solid-state imaging sensing device. As a result, the side surface means between the lead frames are selected as the gripped surface means gripped by the chuck. For this reason, the lead frames and lead lines are omitted in FIGS. 1 to 9.

In FIG. 2(B), three chucks are used to grippe the cerdip type of solid-state image sensing device 1 in which the two chucks grip the upper side surfaces of the device 1 and one chuck grips the lower side surfaces of the device 1. One chuck may be disposed on each of the upper and lower side surfaces, without being limited to the three chucks.

As described above, according to the aforementioned cerdip type of solid-state image sensing device of the first embodiment, because it has the gripped structure in which the gripped surface means parallel with the plane including the optical and main scanning directions is provided, and this gripped surface means can be directly gripped by the chuck 10 having the engaged surface 10a which similarly is parallel with the plane including the optical and main scanning directions, it is able to provide an image reading apparatus having a very high accuracy of positioning adjustment by use of the cerdip type of solid-state image sensing device 1 having a lower cost. It is, also, able to maintain a enough contacting area which can be gripped although the cerdip type of solid-state image sensing device 1 is formed to thin, since the gripped surface means is composed of the side surfaces 2a, 4a and 6a.

There is, also, an advantageous effect that adjustment of the direction of the α axis is not required, since the gripped surface means of the cerdip type of solid-state image sensing device 1 and engaged surface 10a of the chuck 10 are parallel with the plane including the optical and main scanning directions.

Figure 3:
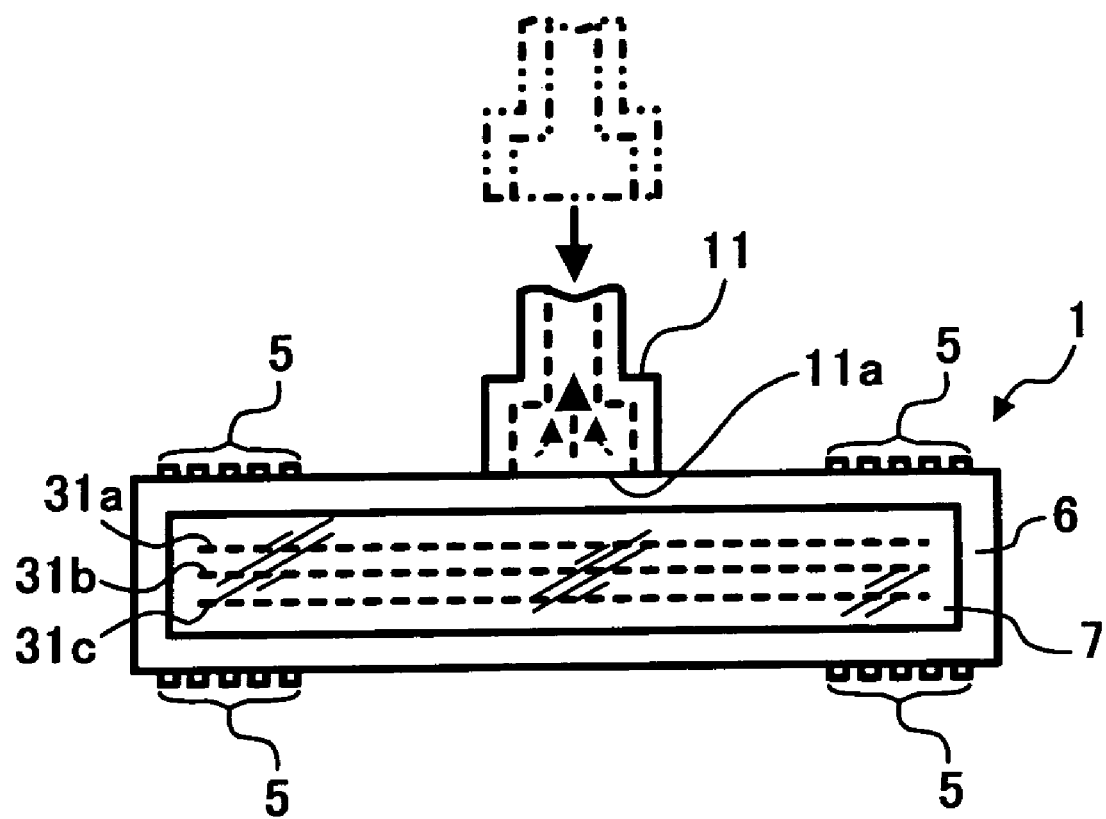
FIG. 3 is a view showing a modification of gripping the cerdip type of solid-state image sensing device in FIG. 1 by the chuck of the producing apparatus in the image reading apparatus and is a view showing the cover glass from the Z axis direction similarly to FIG. 2(B).

FIG. 3 shows a modification of gripping the cerdip type of solid-state image sensing device as shown in FIG. 1 by a chuck 11 in a producing apparatus of an image reading apparatus. FIG. 3 is a view of the cover glass side viewed from the direction of the Z axis similarly to FIG. 2(B).

As shown in FIG. 3, the chuck 11 has a form of air-suction. The air-suction type of chuck 11 has an engaged surface 11a formed to correspond to a plane for contacting with the gripped surface means of the cerdip type of solid-state image sensing device 1. More specifically, the engaged surface 11a contacts tightly with the gripped surface means and sucks to grip it.

The chuck 11 may be used in either the upper side surfaces or the lower side surfaces of the cerdip type of solid-state image sensing device 1.

Alternatively, the two chucks 11 may be provided on both the upper and lower side surfaces of the cerdip type of solid-state image sensing device 1. Also, a plurality of chucks may be disposed on one of the upper and lower side surfaces. The chuck 11 may be replaced by a chuck 10 used in embodiments which will be described hereinafter.

Figure 4:
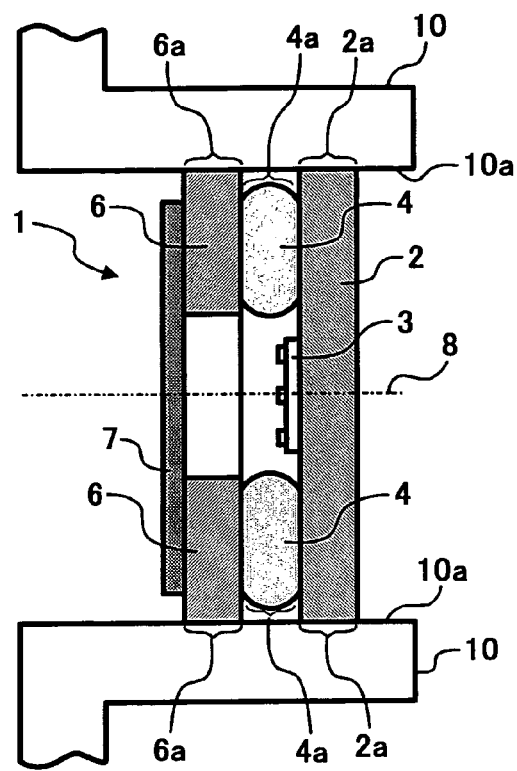
FIG. 4 is a view showing a cerdip type of solid-state image sensing device in a second embodiment according to the present invention and is a view as viewed from the same direction as the cerdip type of solid-state image sensing device in FIG. 1, similarly to FIG. 2(A).

FIG. 4 shows a cerdip type of solid-stated image sensing device in a second embodiment according to the present invention and is a view showing the same state as the cerdip type of solid-state image sensing device of FIG. 1, similarly to FIG. 2(A).

Side surface means of the cerdip type of solid-state image sensing device 1 in the second embodiment is composed of upper and lower side surfaces 2a of the base 2 and upper and lower side surfaces 6a of the wind frame 6. These side surfaces place in the same plane as gripped surface means gripped by any chuck 10.

The side surfaces are parallel with the plane including optical and main scanning directions as described above and most project to a direction vertical to the plane including the optical and main scanning directions, namely from the other side surfaces of the device 1.

These side surfaces 2a and 6a contact with an engaged surface 10a of the chuck 10 for adjustment of position.

In order to form the side surfaces 2a and 6a in a parallel state with the plane including the optical and main scanning directions, for example, after the base 2 and wind frame 6 are bonded by the sealed glass 4 to project from the side surfaces 4a of the sealed glass 4 in sideward, the side surfaces 2a and 6a are simultaneously ground with the cerdip type of solid-state image held by a jig.

Since the side surfaces 2a and 6a project over the side surface 4a after grinding, the side surface 4a may be any configuration, for example, a flat, convex, concave surface or the like.

In the cerdip type of solid-state image sensing device 1 in the second embodiment, since the side surface means is composed of the side surfaces 2a and 6a of the base 2 and wind frame 6 which are made of ceramic having a high stiffness, as compared with the first embodiment, even though a gripped area is less, the same gripped accuracy can be obtained. Also, the same material is ground and therefore a high ground performance is obtained. Further, a used amount of the sealed glass 4 is minimized.

Figure 5:
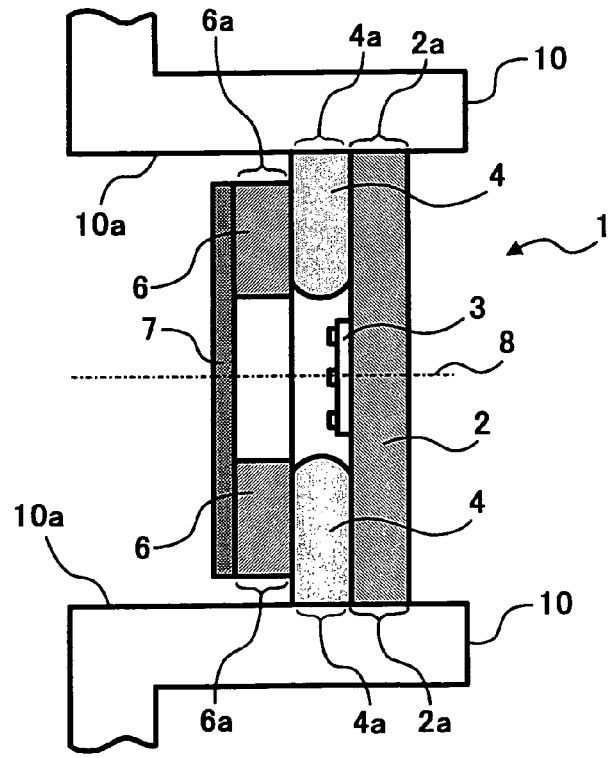
FIG. 5 is a view showing a cerdip type of solid-state image sensing device in a third embodiment according to the present invention and is a view as viewed from the same direction as the cerdip type of solid-state image sensing device in FIG. 1, similarly to FIG. 2(A).

FIG. 5 shows a cerdip type of solid-state image sensing device in a third embodiment according to the present invention and is a view as viewed from the same direction as the cerdip type of solid-state image sensing device in FIG. 1.

Side surface means of the cerdip type of solid-state image sensing device in the third embodiment is composed of the side surfaces 2a and 4a of the base 2 and sealed glass 4.

The side surfaces 2a and 4a are the same plane and are parallel with the plane including the optical and main scanning directions, and further most project in the vertical direction to the plane including the optical and main scanning directions, as described above. These side surfaces contact with the aforementioned engaged surface 10a of the chuck 10 for adjustment.

In order to form the side surfaces 2a and 4a in a parallel state with the plane including the optical and main scanning directions, for example, after the base 2 and wind frame 6 are bonded by the sealed glass 4, the side surfaces 2a and 6a are simultaneously ground with the cerdip type of solid-state image held by a jig.

Since the side surfaces 2a and 4a project over the side surfaces 6a after grinding, the side surfaces 6a may be any configuration, for example, a flat, convex, concave surface or the like.

Figure 6:
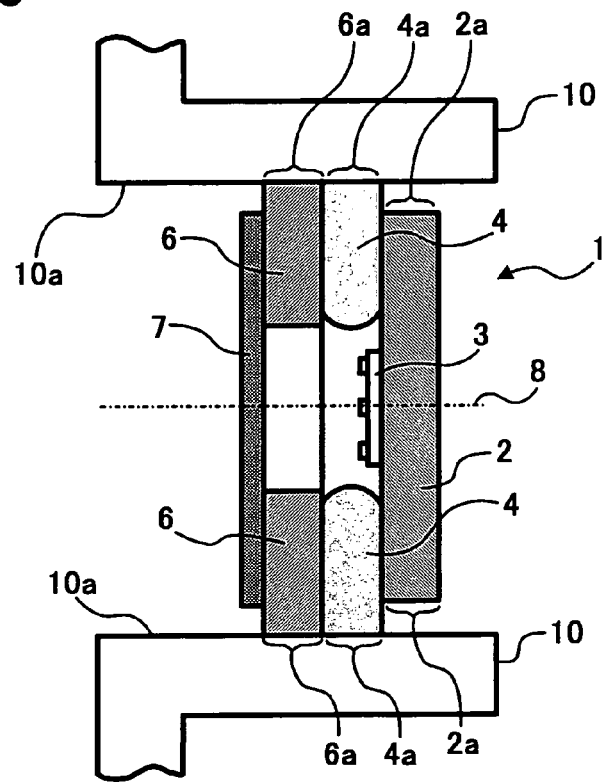
FIG. 6 is a view showing a cerdip type of solid-state image sensing device in a fourth embodiment according to the present invention and is a view as viewed from the same direction as the cerdip type of solid-state image sensing device in FIG. 1, similarly to FIG. 2(A).

FIG. 6 shows a cerdip type of solid-state image sensing device in a fourth embodiment according to the present invention and is a view as viewed from the same direction as the cerdip type of solid-state image sensing device in FIG. 1.

Side surface means of the cerdip type of solid-state image sensing device in the fourth embodiment is composed of the side surfaces 4a and 6a of the sealed glass 4 and wind frame 6.

The side surfaces 4a and 6a are the same plane and are parallel with the plane including the optical and main scanning directions, and further most project in the vertical direction to the plane including the optical and main scanning directions, as described above. These side surfaces contact with the aforementioned engaged surface 10a of the chuck 10 for adjustment.

In order to form the side surfaces 4a and 6a in a parallel state with the plane including the optical and main scanning directions, for example, after the base 2 and wind frame 6 are bonded by the sealed glass 4, the side surfaces 4a and 6a are simultaneously ground with the cerdip type of solid-state image held by a jig.

Since the side surfaces 4a and 6a project over the side surfaces 2a after grinding, the side surfaces 2a may be any configuration, for example, a flat, convex, concave surface or the like.

Figure 7:
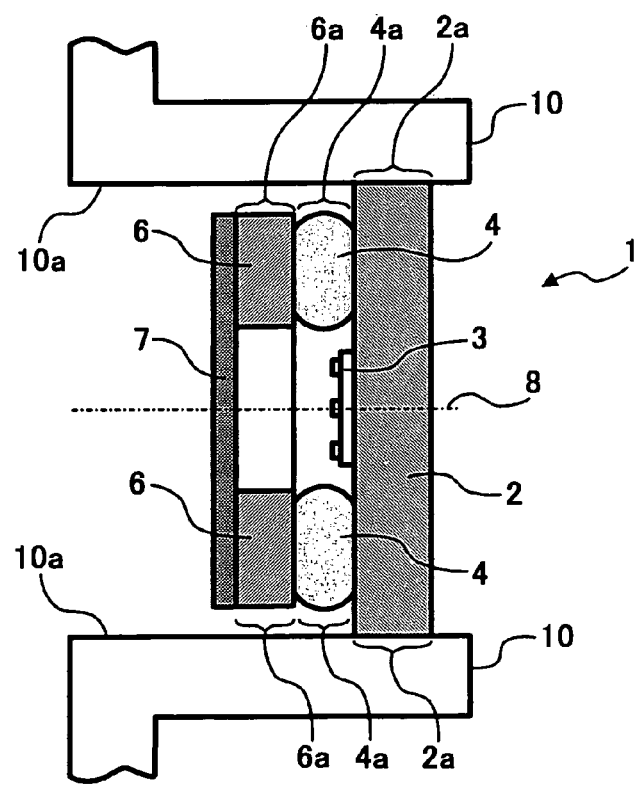
FIG. 7 is a view showing a cerdip type of solid-state image sensing device in a fifth embodiment according to the present invention and is a view as viewed from the same direction as the cerdip type of solid-state image sensing device in FIG. 1, similarly to FIG. 2(A).

FIG. 7 shows a cerdip type of solid-state image sensing device in a fifth embodiment according to the present invention and is a view as viewed from the same direction as the cerdip type of solid-state image sensing device in FIG. 1.

Side surface means of the cerdip type of solid-state image sensing device in the fifth embodiment is composed of the side surfaces 2a of the base 2.

The side surfaces 2a are the same plane and are parallel with the plane including the optical and main scanning directions, and further most project in the vertical direction to the plane including the optical and main scanning directions, as described above. The side surfaces 2a contact with the aforementioned engaged surface 10a of the chuck 10 for adjustment.

In order to form the side surfaces 2a in a parallel state with the plane including the optical and main scanning directions, for example, after the base 2 and wind frame 6 are bonded by the sealed glass 4, the side surfaces 2a are ground with the cerdip type of solid-state image held by a jig.

Since the side surfaces 2a project over the side surface 4a and 6a after grinding, the side surface 4a and 6a may be any configuration, for example, a flat, convex, concave surface or the like. Also, the thickness (length of the optical direction) of the side surfaces 2a of the base 2 may be large depending on a necessary accuracy. For example, the thickness is preferably 2 to 3 mm.

Figure 8:
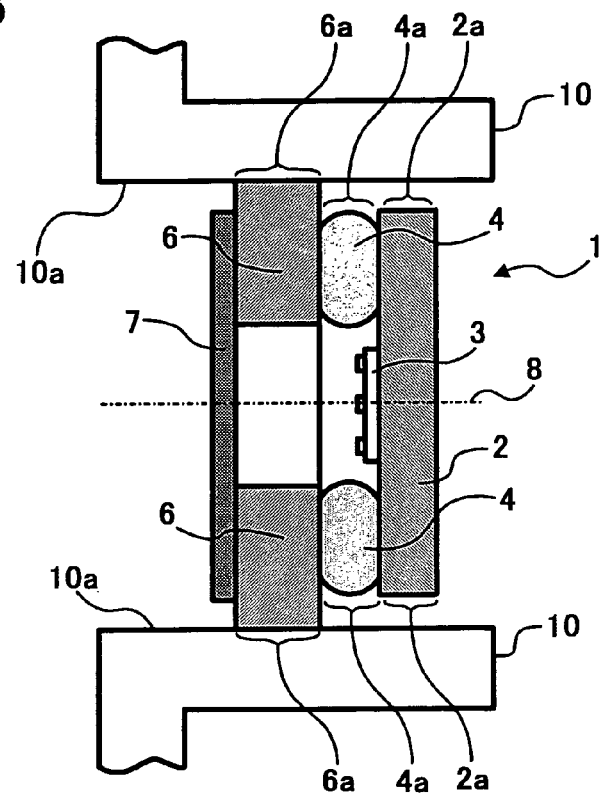
FIG. 8 is a view showing a cerdip type of solid-state image sensing device in a sixth embodiment according to the present invention and is a view as viewed from the same direction as the cerdip type of solid-state image sensing device in FIG. 1, similarly to FIG. 2(A).

FIG. 8 shows a cerdip type of solid-state image sensing device in a sixth embodiment according to the present invention and is a view as viewed from the same direction as the cerdip type of solid-state image sensing device in FIG. 1.

Side surface means of the cerdip type of solid-state image sensing device in the sixth embodiment is composed of the side surfaces 6a of the wind frame 6.

The side surfaces 6a are the same plane and are parallel with the plane including the optical and main scanning directions, and further most project in the vertical direction to the plane including the optical and main scanning directions, as described above. The side surfaces 6a contact with the aforementioned engaged surface 10a of the chuck 10 for adjustment.

In order to form the side surfaces 6a in a parallel state with the plane including the optical and main scanning directions, for example, after the base 2 and wind frame 6 are bonded by the sealed glass 4, the side surfaces 6a are ground with the cerdip type of solid-state image held by a jig.

Since the side surfaces 6a project over the side surfaces 2a and 4a after grinding, the side surfaces 2a and 4a may be any configuration, for example, a flat, convex, concave surface or the like. Also, the thickness (length of the optical direction) of the side surfaces 6a of the wind frame 6 may be large depending on a necessary accuracy. For example, the thickness is preferably 2 to 3 mm.

Figure 9:
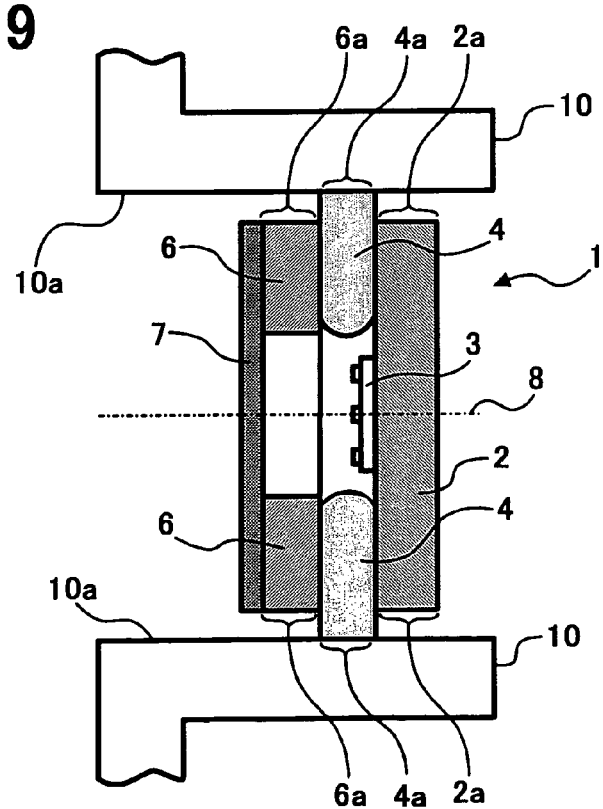
FIG. 9 is a view showing a cerdip type of solid-state image sensing device in a seventh embodiment according to the present invention and is a view as viewed from the same direction as the cerdip type of solid-state image sensing device in FIG. 1, similarly to FIG. 2(A).
Figure 10:
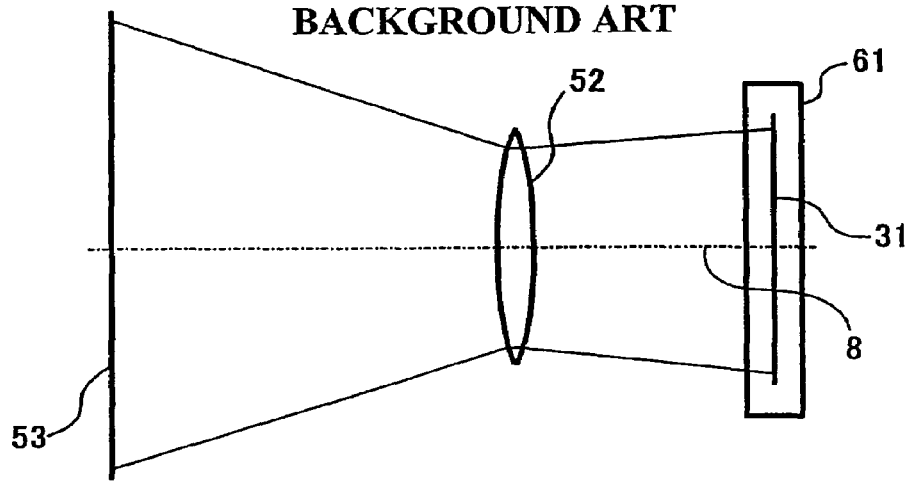
FIG. 10 is a view showing an optical positioning relationship of an object and a focus lens.
Figure 11:
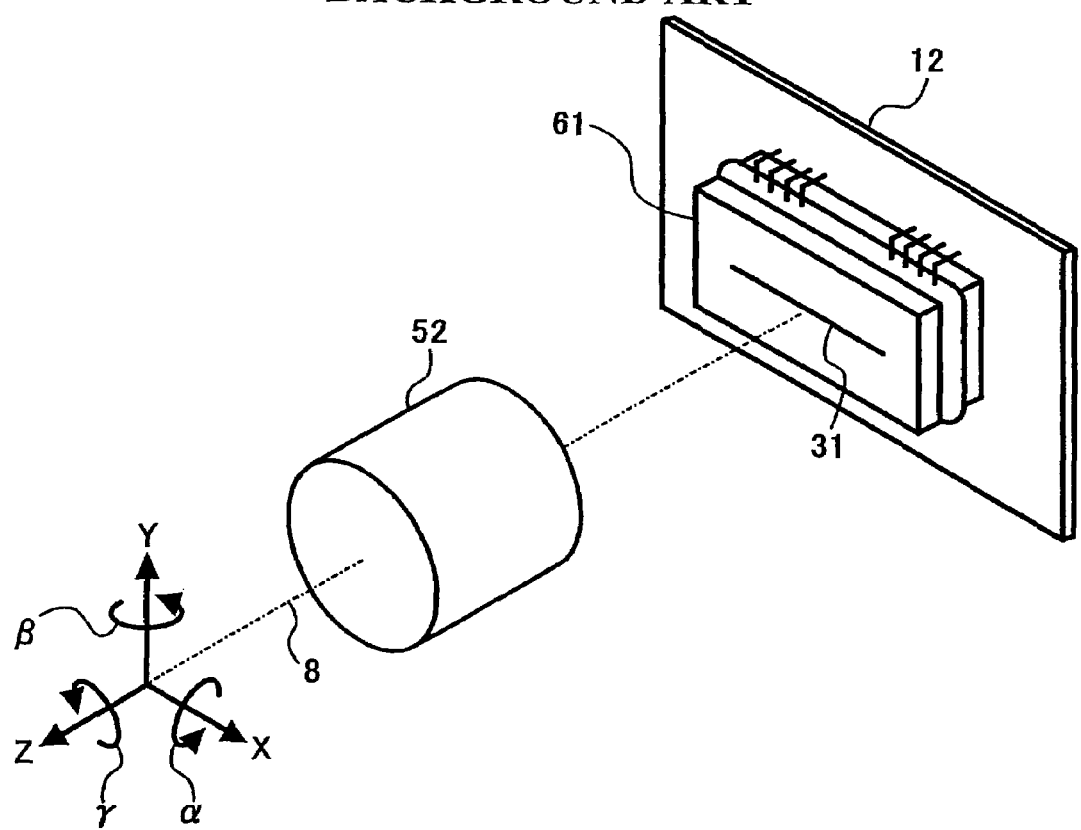
FIG. 11 is a view showing a coordinate of six axes in a solid-state image sensing device and the focus lens.
Figure 12:
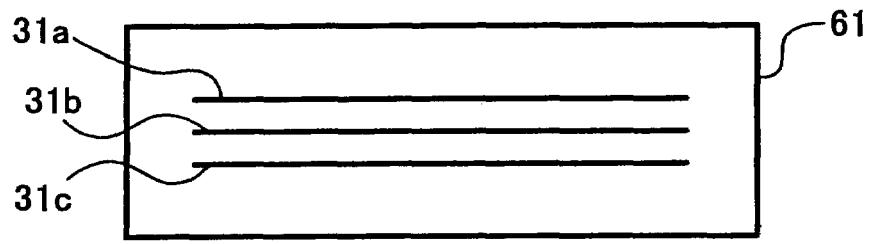
FIG. 12 is a font view showing a conventional solid-state image sensing device.

FIG. 9 shows a cerdip type of solid-state image sensing device in a seventh embodiment according to the present invention and is a view as viewed from the same direction as the cerdip type of solid-state image sensing device in FIG. 1.

Side surface means of the cerdip type of solid-state image sensing device in the seventh embodiment is composed of the side surfaces 4a of the sealed glass 4.

The side surfaces 4a are the same plane and are parallel with the plane including the optical and main scanning directions, and further most project in the vertical direction to the plane including the optical and main scanning directions, as described above. The side surfaces 4a contact with the aforementioned engaged surface 10a of the chuck 10 for adjustment.

In order to form the side surfaces 4a in a parallel state with the plane including the optical and main scanning directions, for example, after the base 2 and wind frame 6 are bonded by the sealed glass 4, the side surfaces 4a are ground with the cerdip type of solid-state image held by a jig.

Since the side surfaces 4a project over the side surfaces 2a and 4a after grinding, the side surfaces 2a and 6a may be any configuration, for example, a flat, convex, concave surface or the like. Also, the thickness (length of the optical direction) of the side surfaces 4a of the sealed glass 4 may be large depending on a necessary accuracy. For example, the thickness is preferably 2 to 3 mm.

As described above, according to the present invention, it is able to use the cerdip type of solid-state image sensing device having a low cost because the cerdip type of solid-state image sensing device has the gripped structure comprises a plurality of side surfaces which are parallel with the optical and main scanning directions and most project in the vertical direction to the plane including the optical and main scanning directions to be gripped effectively by the chuck, whereby enabling the high-accuracy adjustment of position of the cerdip type of solid-state image sensing device in a step of producing the image reading apparatus.

Although the some embodiments have been described, the present invention is not limited to these embodiments and various changes and modifications can be made without departing the gist of the present invention.

What is claimed is:

1. A cerdip type of solid-state image sensing device comprising:
   a base on which photoelectric transfer devices are arranged in line along a main scanning direction;
   a sealed glass disposed on said base for fixing a lead frame;
   a wind frame disposed on said sealed glass;
   a transparent cover glass disposed on said wind frame; and
   gripped surface means for gripping said cerdip type of solid-state image sensing device.

2. A cerdip type of solid-state image sensing device according to claim 1, wherein said gripped surface means is formed by grinding a portion of outer peripheral surfaces of said base, sealed glass, wind frame and cover glass after they are superposed.

3. A cerdip type of solid-state image sensing device comprising:
   a base on which photoelectric transfer devices are arranged in line along a main scanning direction;
   a sealed glass disposed on said base for fixing a lead frame;
   a wind frame disposed on said sealed glass;
   a transparent cover glass disposed on said wind frame; and
   gripped surface means provided on said cerdip type of solid-state image sensing device to grip it,
   said gripped surface means being composed of side surfaces of one or more of said base, sealed glass, wind frame and cover glass,
   said side surfaces which are gripped being parallel with a direction that said base, sealed glass, wind frame and cover glass are superposed and said main scanning direction, and most projecting over the side surfaces which are not gripped in a vertical direction to a plane including said superposed and main scanning directions.

4. A cerdip type of solid-state image sensing device according to claim 3, wherein said gripped surface means is composed of the side surfaces of said base, sealed glass and wind frame.

5. A cerdip type of solid-state image sensing device according to claim 3, wherein said gripped surface means is composed of the side surfaces of said base and wind frame.

6. A cerdip type of solid-state image sensing device according to claim 3, wherein said gripped surface means is comprised of the surfaces of said base and sealed glass.

7. A cerdip type of solid-state image sensing device according to claim 3, wherein said gripped surface means is composed of the side faces of said sealed glass and wind frame.

8. A cerdip type of solid-state image sensing device according to claim 3, wherein said gripped surface means is composed of the side surfaces of said base.

9. A cerdip type of solid-state image sensing device according to claim 3, wherein said gripped surface means is composed of the side surfaces of said sealed glass.

10. A cerdip type of solid-state image sensing device according to claim 3, wherein said gripped surface means is composed of the side surfaces of said wind frame.

11. A structure for gripping a cerdip type of solid-state image sensing device comprising:
    a base on which photoelectric transfer devices are arranged in line along a main scanning direction;
    a sealed glass disposed on said base for fixing a lead frame;
    a wind frame disposed on said sealed glass;
    a transparent cover glass disposed on said wind frame; and
    gripped surface means provided on one or more of said base, sealed glass, wind frame and cover glass for gripping said cerdip type of solid-state image sensing device.

* * * * *